(12) United States Patent
Ravelosona-Ramasitera et al.

(10) Patent No.: US 6,605,321 B1
(45) Date of Patent: Aug. 12, 2003

(54) METHOD OF TREATING MATERIALS BY IRRADIATION

(75) Inventors: Dafiné Ravelosona-Ramasitera, Orsay (FR); Claude Chappert, Garches (FR); Véronique Mathet, Palaiseau (FR); Harry Bernas, Paris (FR)

(73) Assignee: Centre National de la Recherche Scientifique (CNRS) (FR)

( * ) Notice: Subject to any disclaimer, the term of this patent is extended or adjusted under 35 U.S.C. 154(b) by 0 days.

(21) Appl. No.: 09/619,797

(22) Filed: Jul. 20, 2000

(51) Int. Cl.[7] .............................. B05D 3/06; B05D 5/00; C23C 14/48; C23C 14/14; C30B 1/02
(52) U.S. Cl. ...................... 427/528; 427/523; 427/130; 427/132; 427/533; 117/4; 117/8; 117/7
(58) Field of Search ................................ 427/523, 529, 427/530, 531, 528, 130, 132, 524, 533, 534; 117/92, 108, 4, 7, 8; 438/797, 798

(56) References Cited

U.S. PATENT DOCUMENTS

| | | | | |
|---|---|---|---|---|
| 3,926,682 A | * | 12/1975 | Shimada et al. | 117/17 |
| 4,339,869 A | * | 7/1982 | Reihl et al. | |
| RE31,151 E | * | 2/1983 | King | |
| 4,568,598 A | * | 2/1986 | Bilkadi et al. | 427/129 |
| 4,966,885 A | * | 10/1990 | Hebard | 427/62 |
| 5,372,089 A | * | 12/1994 | Yoshida et al. | 117/98 |
| 5,501,911 A | * | 3/1996 | Ebe et al. | 427/533 |
| 5,792,510 A | * | 8/1998 | Farrow et al. | 427/130 |
| 6,007,623 A | * | 12/1999 | Thiele et al. | 117/95 |
| 6,063,246 A | * | 5/2000 | Wolfe et al. | 427/523 |
| 6,096,439 A | * | 8/2000 | Bull et al. | 427/523 |
| 6,103,010 A | * | 8/2000 | Belouet | 117/108 |
| 6,214,772 B1 | * | 4/2001 | Iijima et al. | 427/62 |
| 6,288,357 B1 | * | 9/2001 | Dyer | 438/697 |
| 6,294,223 B1 | * | 9/2001 | Hampikian et al. | 427/529 |
| 6,331,364 B1 | * | 12/2001 | Baglin et al. | 428/694 T |
| 6,383,598 B1 | * | 5/2002 | Fullerton et al. | 428/65.7 |
| 6,500,676 B1 | * | 12/2002 | Ramberg | 438/3 |

OTHER PUBLICATIONS

"High Anisotropy L10 Thin Films for Longitudinal Recording" Coffey et al, *IEEE Transactions of Magnetics*, vol. 31, No. 6; Nov. 1995 p. 2737–2739.

"Control of the Axis of Chemical Ordering and Magnetic Anisotropy in Epitaxial FePt Films", Farrow et al; *J. Appl. Phys.*, 79(8), Apr. 15, 1996 p. 5967–5969.

"Enhanced Magneto–Optical Kerr Effect in Spontaneously Ordered FePt Alloys: Quantitative Agreement Between Theory and Experiment" Cebollada et al; *Physical Review B*, vol. 50, No. 5, Aug. 1, 1994, p. 3419–3422.

"Magnetic Domains in Epitaxial Ordered FePd(001) Thin Films with Perpendicular Magnetic Anisotropy", Gehanno et al; *Physical Review B*, vol. 55, No. 18, May 1, 1997; p. 12,552–12,555.

"The Influence of the Pt Buffer Layer on the Perpendicular Magnetic Anisotropy in Epitaxial FePD(001) Ordered Alloys Grown by Sputtering", *J. Appl. Phys.*, 81 (8) Apr. 15, 1997 p. 5050–5052.

(List continued on next page.)

*Primary Examiner*—Marianne Padgett
(74) *Attorney, Agent, or Firm*—Blakely, Sokoloff, Taylor & Zafman

(57) ABSTRACT

The invention provides a method of treating a material to cause the material to evolve from one phase to a more ordered phase, the method comprising an operation of irradiating the material in which the irradiating particles are suitable, by their nature and by their energy, for inducing displacements of the atoms in the material towards positions that favor ordering of the material. Advantageously, the invention also provides apparatus for magnetically recording information, the apparatus comprising a material deposited on a substrate at a temperature of less than 350° C. and that has been subjected to irradiation with irradiating particles that are suitable, by their nature and their energy, for inducing displacements of the atoms in the material towards positions that favor relaxation of the material.

18 Claims, 3 Drawing Sheets

OTHER PUBLICATIONS

"Direct Formation of Ordered CoPt and FePt Compound Thin Films by Sputtering" Visokay et al; *Appl. Phys. Lett.*, 66(13), Mar. 27, 1995, p. 1692–1694.

"Formation of Epitaxial (001) Ordered FePd Films from Multilayer Precursors (Invited)"; Visokay et al; *The Magnetics Society of Japan*, 1994 (no month) p. 399–403.

"Characterization of Ion–Beam Mixed Multilayers via Grazing X-ray Reflectometry" LeBaté et al; *J. Mater. Res.*, 3(6), Nov./Dec. 1988, p. 1089–1096.

"Study of Ion Beam Mixed Multilayers via Neutron Scattering", LeBoité et al, *Materials Letters*; vol. 6, No. 5,6, Mar. 1988; p. 173–176.

"Quantitative Description of Mixing with Light Ions" Traverse et al; *Europhysic Letters*, 8(7) pp. 633–637, Apr. 1, 1989.

"Magnetic Domain Structures in Thin Uniaxial Plates with Perpendicular Easy Axis"; Cape et al; *J. Appl. Physics*, vol. 42, No. 13, Dec. 1971, p. 5732–5756.

"Device Implications of the Theory of Cylindrical Magnetic Domains"; A.A. Thiele; The Bell System Technical Journal, vol. 50, No. 3 Mar. 1971 p. 725–773.

* cited by examiner

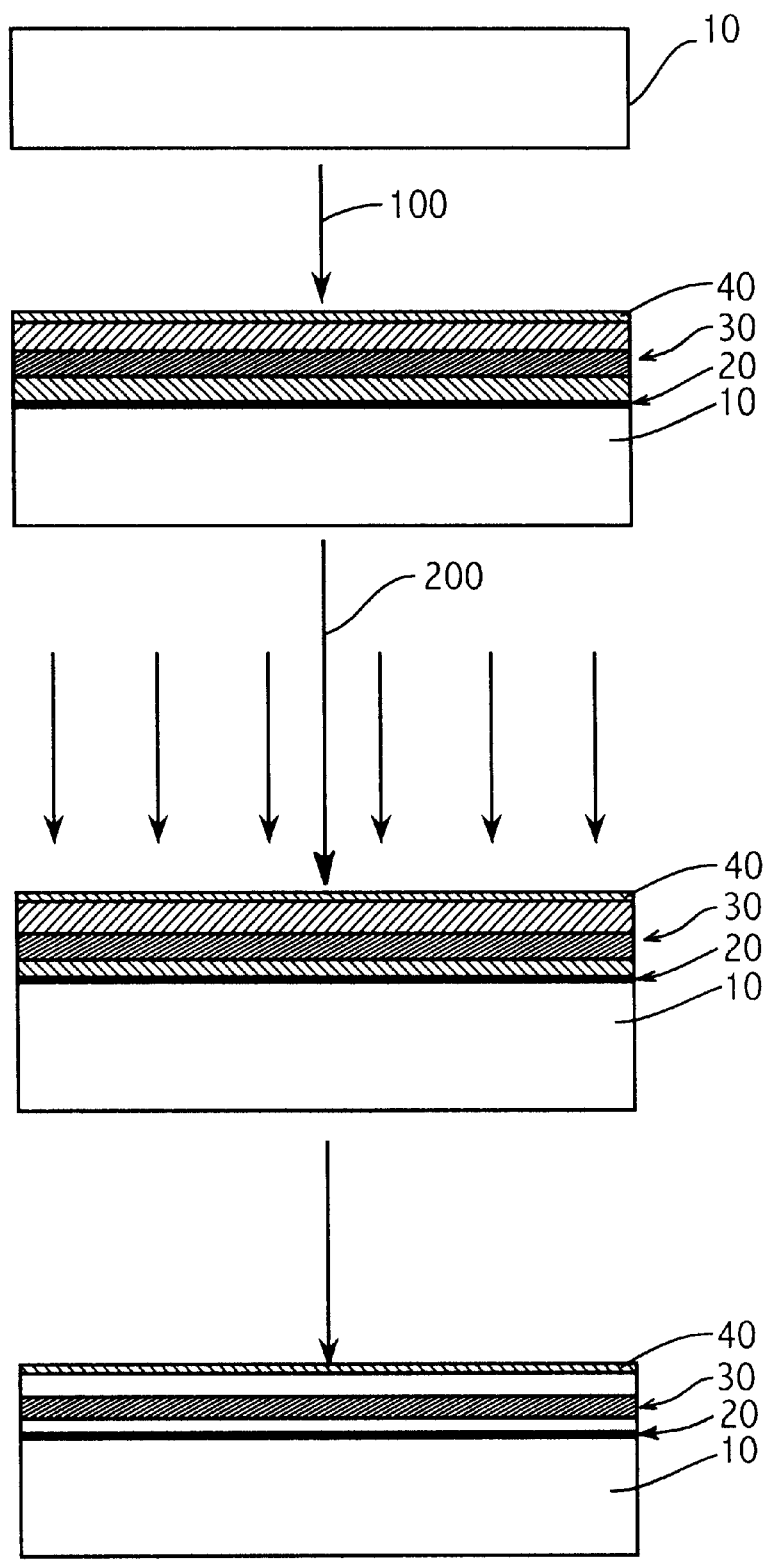
FIG_1

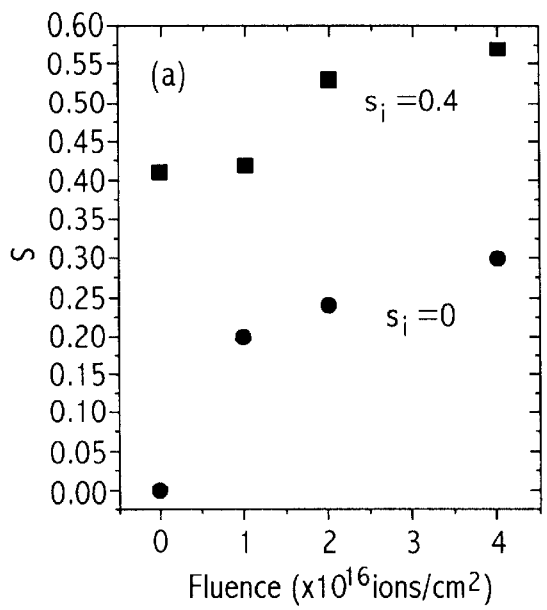
FIG_2a
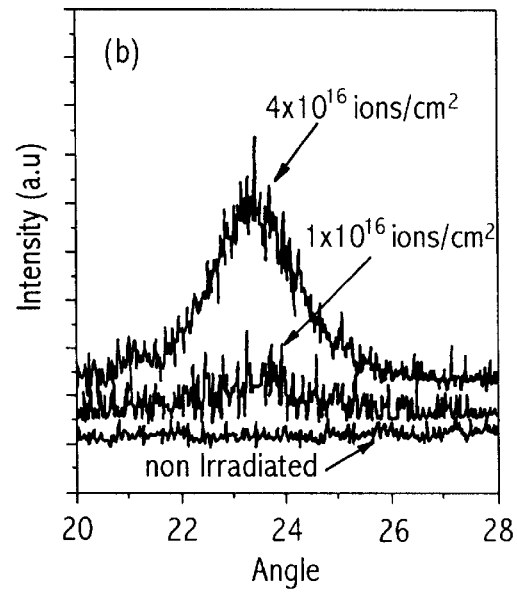
FIG_2b
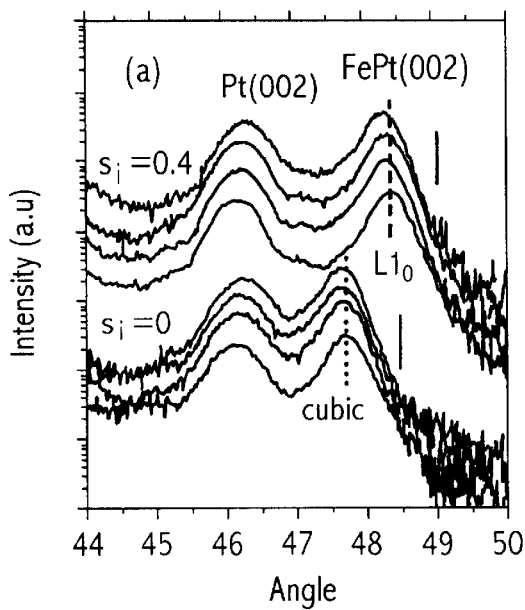
FIG_3a
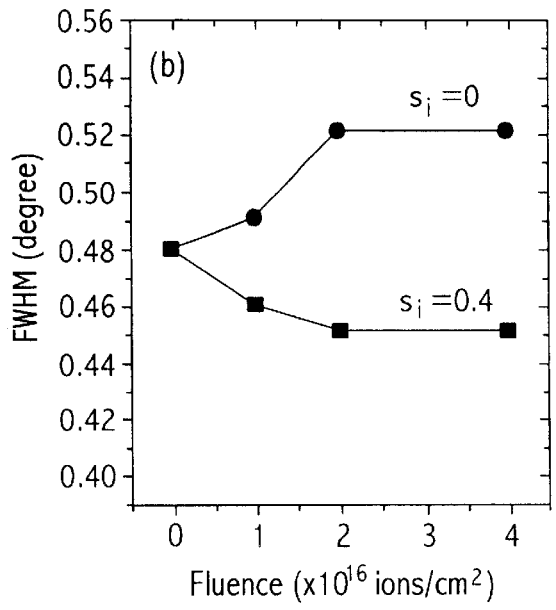
FIG_3b

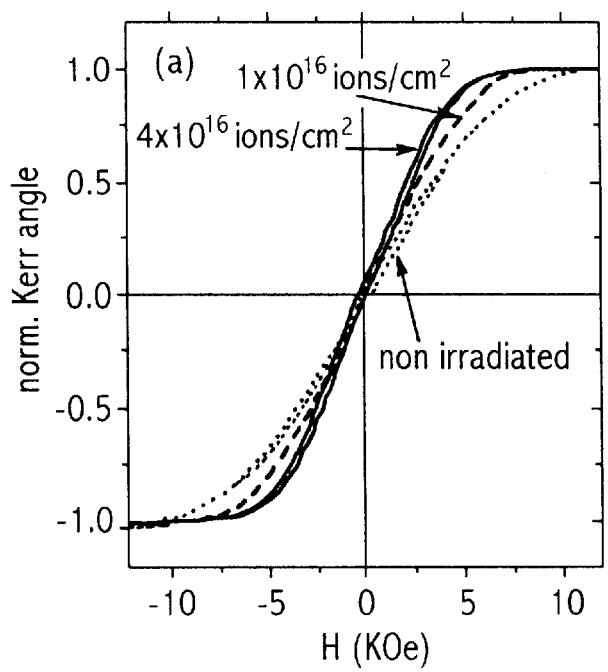
FIG_4a
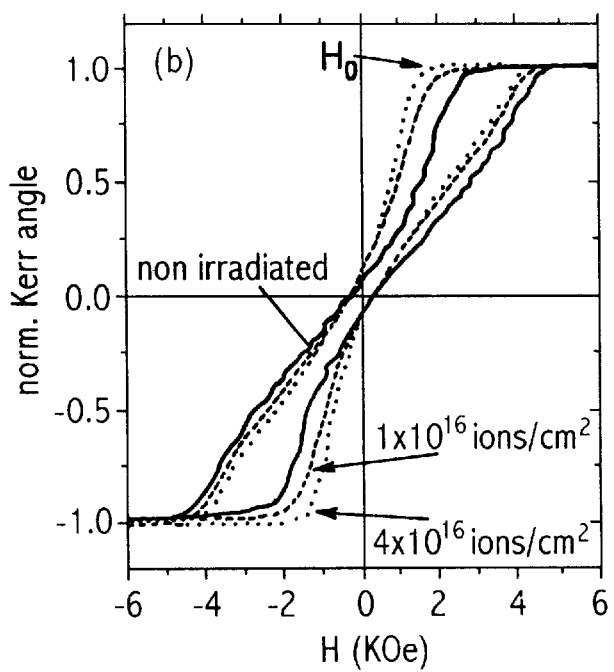
FIG_4b

METHOD OF TREATING MATERIALS BY IRRADIATION

FIELD OF THE INVENTION

The present invention relates to a method of treating a material, enabling the material to be caused to pass from one phase to a more ordered phase. For example, the present invention applies to imparting chemical order to magnetic alloys, in order to enhance their magnetic anisotropy.

State of the art

Numerous phase transition methods are already known whereby a material is caused to pass from one phase to a more ordered phase by applying heat treatment. Numerous methods are also known that enable ordered phases of a material to be obtained directly at high temperature.

In particular, such methods are known that are applied to synthesizing magnetic alloys deposited on substrates.

Thus, certain magnetic alloys of the $L1_0$ type, such as $Fe_{50}$ $Pt_{50}$, $Fe_{50}$ $Pd_{50}$ and $Co_{50}$ $Pd_{50}$ type have high magnetic anisotropy and therefore present a particular advantage in applications where they are used for magnetic recording (K. R. Coffey, M. A. Parker, and J. K. Howard, IEE Trans. Magn., n°31,. P.2737 (1995)). Such alloys present magnetic anisotropy that is twenty times greater than that of the cobalt-based alloys that are presently being used for computer hard disks. These alloys have periodically alternating planes each made up of atoms of a single species of the alloy. The ordered phase of these alloys, i.e. the phase having the highest magnetic anisotropy, can be obtained only by methods that require the use of high temperatures for synthesis. For example, such alloys were so far obtained:

either by epitaxial growth on monocrystalline substrates at a temperature of 500° C. by cathode sputtering or by molecular beam epitaxy (R. F. C. Farrow, D. Weller, R. F. Marks, M. F. Toney, A. Cebollada, and G. R. Harp, J. Appl. Phys., n°79, p. 5967 (1996); A. Cebollada, D. Weller, J. Sticht, G. R. Harp, R. F. C. Farrow, R. Marks, R. Savoy, and J. C. Scott, Phys. Rev. B, n°50, p.3419 (1994), V. Gehanno, A. Marty, B. Gilles, and Y. Samson, Phys. Rev. B, n°55, P.12552 (1997), P. Caro, A. Cebollada, D. Ravelosona, F. Briones, D. Garcia, M. Vasquez, A. Hernando, J. Appl. Phys., n°81, p.5050 (1997); M. Visokay and R. Sinclair, Appl. Phys. Lett., n°66, p.1692 (1995));

or by thermally annealing films previously deposited on monocrystalline substrates by cathode sputtering or by molecular beam epitaxy, the films being annealed at temperatures greater than 700° C. (M. R. Visokay, B. M. Lairson, B. M. Clemens, R. Sinclair, J. Magn. Soc. Japan n°19, p.399 (1995));

or else by thermally annealing disordered granular films of grain size less than 10 nm as previously deposited on amorphous substrates, e.g. of the $SiO_2$ type by cathode sputtering or by molecular beam epitaxy, the films being annealed at temperatures greater than 600° C.

In any event, the use of a high growth temperature, in particular a temperature greater than about 350° C., is a major drawback in an industrial application since in addition to being relatively complex and expensive in energy terms, it can give rise to irreversible modifications of the substrate used for the recording medium. Furthermore, annealing disordered granular films does not enable ordered films to be obtained having uniform magnetic anisotropy. The orientation of the grains in such materials corresponds to a relatively broad distribution.

An object of the invention is to provide a method of treating a material enabling said material to be caused to pass from one phase to a more ordered phase, while avoiding the use of high temperatures.

According to the invention, this object is achieved by a method of treating a material to cause it to pass from one phase to a more ordered phase, the method comprising an operation of irradiating the material by low energy ions having an energy of the order one or two hundreds keV, the irradiation by said low energy ions inducing displacements of the atoms in the material towards positions that favor ordering of the material.

It is hereby recalled that light ions are ions having a mass below or equal to 16 atomic mass units.

By the method of the invention, certain atoms of the material are caused to be displaced, thereby enabling local rearrangement of the atomic array in a way that tends to decrease the free energy of the material. This rearrangement corresponds in particular to favoring chemical order in the material. The irradiation performs a function somewhat similar to that of a high temperature heat treatment, by means of the energy supplied by the irradiating particles, the difference being that—as opposed to thermal treatment—the order induced by irradiation is initiated by the low energy transfers due to atomic collisions.

Advantageously, the material is heated during its irradiation. The heating allows to control the atomic rearrangement towards quasi-equilibrium atomic positions. The heating favours atomic mobilities but do not replace collisions of the irradiating particles with the atomic lattice of the material.

The method of the invention advantageously includes the following characteristics, taken independently or in combination:

prior to the irradiation operation, the method includes an operation of depositing a thin layer of material on a substrate;

the material is an alloy or a compound; the alloy is advantageously a binary alloy whose most ordered phase is essentially made up of a stack of planes of atoms each comprising a majority of one of the component species of the alloy;

the material is magnetic;

the material is an alloy of iron and platinum, or cobalt and platinum, or ion and palladium;

the material is heated at a temperature of 350° C. or less during the irradiation, advantageously this temperature is comprised between room temperature and 350° C.;

the irradiating particles are helium ions;

the material is bombarded with an irradiating particle density of $5.10^{15}$ to $4 \times 10^{16}$ particles per square centimeter;

the material to be ordered by the irradiation operation is initially in a disordered or partially ordered state;

the material to be ordered is underlying other layers of material;

several superimposed layers are ordered simultaneously;

the irradiating particles bombard the material through a mask.

An advantageous application of the invention lies in the field of ultra-high density magnetic recording. The extraordinary development of multimedia technologies and services over the last few years has resulted in a race to increase recording density. The main limit on present magnetic recording techniques appears to be the "paramagnetic limit", i.e. the size beneath which recorded bits fade away by a thermal effect. Several ways have been proposed for pushing back that limit. Thus, it has recently been proposed to replace the present recording medium material by discrete materials in which magnetic anisotropy boundaries are defined geometrically by lithographic methods. Nevertheless, the various techniques proposed on those lines require major changes to present hard disk technology. Another technique that has been considered for mitigating the fundamental paramagnetic limit is to use new materials having stronger magnetic anisotropy. This makes it possible to use grains of smaller size. This alternative appears to be more promising in the short term since it does not require major changes to present magnetic media technology. By means of the invention, a method is made available for chemically ordering a magnetic alloy at a temperature that is relatively low. By means of the invention, the imparting of chemical order is favored in alloys of the $Fe_{50} Pt_{50}$, $Fe_{50} Pd_{50}$ and $Co_{50} Pd_{50}$ type. By means of this ordering, magnetic anisotropy is increased and magnetic recording materials are obtained for storing information at very high density. These materials have thermally stable grain sizes down to 3 nm, thereby making it possible to obtain storage densities of the order of tera bits per square centimeter (whereas present materials are limited to 100 giga bits per square centimeter).

In another aspect, the invention provides apparatus for magnetically recording information, the apparatus comprising a material deposited on a substrate at a temperature of less than 350° C. and subjected to irradiation with irradiating particles suitable, by their nature and by their energy, for inducing displacements of the atoms in the material towards positions that favor relaxation of the material.

A further understanding of the nature and advantages of the present invention may be realized by reference to the latter portions of the specification and attached drawings.

BRIEF DESCRIPTION OF DRAWINGS

FIG. 1. is a simplified diagram illustrating a method of treating a material, according to the invention.

FIG. 2. (a) is a diagram of the long-range order parameter S as a function of fluence for a partially ordered FePt (001) film ($S_i$=0.4) and a disordered one ($S_i$=0). FIG. 2. (b) is a diagram of the progressive increase of the (001) superstructure peak as irradiation proceeds (0, $1.10^{16}$, $4.10^{16}$ ions/cm²) for the disordered film ($S_i$=0). The x-ray diffraction scans were taken in a θ-2θ geometry.

FIG. 3. (a). represents specular (θ-2θ) scans around the (002) fundamental peak as a function of fluence (0, $1.10^{16}$, $2.10^{16}$, $4.10^{16}$ ions/cm² for the FePt(001) films of FIG. 2. The arrows indicate the direction of evolution with increasing fluence. The dashed and dotted lines correspond to the position of the ordered (tetragonal $L1_0$ phase) and disordered (cubic phase) peaks respectively for the non-irradiated films. Note that the position of the fundamental peaks stay nearly constant for both samples. (b) represents the FWHM of the (002) fundamental peak as a function of fluence for the corresponding films.

FIG. 4. represents the polar Kerr loops as a function of the fluence (0, $1.10^{16}$, $4.10^{16}$ ions/cm²) for (a) the disordered film ($S_i$=0) and (b) the partially ordered film ($S_i$=0.4). $H_0$ corresponds to the nucleation field as described in the text.

DESCRIPTION OF THE INVENTION

An example of implementation for the method according to the invention will be described below.

It should be understood that this example is not a restrictive one.

According to this example, disordered (S~0) and partially ordered (S~0.4) FePt than films have been grown.

By means of a first step of cosputtering 100 a sample consisting in a 50 nm thick epitaxial $Fe_{50} Pt_{50}$ (001) layers 10, grown on 15 nm thick Pt (001) seed films 20 on a MgO (001) substrate 20, and capped by a layer of Pt 40 3 nm thick.

The disordered sample (Si~0) has been grown at room temperature and the partially ordered sample (Si~0.4) has been grown at 350° C.

This step of growth has been followed by a second step of irradiation 200.

Irradiation parameters were based on prior studies (M. G. Le Boité, A. Traverse, L. Nevot, B. Pardo, J. Corno, J. Mater. Res., n°3, P.1089 (1988); M. G. Le Boité, A. Traverse, H. Bernas, C. Janot, J. Chevrier, Mater. Lett. n°6, P.173 (1988); A.Traverse, M. G. Le Boité, G. Martin, Europhys. Lett., n°8, p.633 (1989)) of the initial stages of ion-beam mixing in the low displacement density regime. The choice of the irradiating element, of its mass and of its energy permits to control the structural modifications of irradiated material. In order to obtain low uniform displacement densities in the films, the inventors used low energy ions, such as He ions accelerated in a focused ion beam with an energy 130 keV. It is important to note that all the He ions thus stop in the substrate. Fluences Φ between $1.10^{16}$ and $4.10^{16}$ ions per square centimeter were used. According to TRIM simulations (J. Ziegler, J. Biersack, and U. Littmark, *The stopping of Ions in Matter*(Pergamon, N.Y., 1985)), the number of displaced atoms in the FePt layer is about $10^{-3}$ per incoming ion and per nanometer. Hence, after complete irradiation the probability that each atom in the layer has been displaced once is between ~0.25 and 1 time. During the irradiation the sample was heated at 280° C. Thus the beam interaction leads to atomic displacements, while the heating favors local atomic rearrangements and lattice relaxation. No long-range annealing occurs due to this heating since bulk diffusion is negligible below 600° C. Low irradiation current densities were used in order to avoid additional sample heating.

As a result of the irradiation step 200, the long range order due to alternating Fe and Pt planes is enhanced in the samples, as shown by the following results.

Specular XRD scans provide information on both structural and chemical ordering of the films. The order parameter S measuring the long-range order was calculated from the ratio of the integrated intensities of the (001), (002) and (003) peaks. Both (001) and (003) peaks are indicative of the long-range ordered $L1_0$ phase. The $L1_0$ phase is characterized by a periodic stack of monoatomic planes of each elements of the FePt alloy, along the (001) axis. This phase has the most important magnetic anisotropy ever observed to date (20 times greater than that of the Co-based alloys that are used for hard disks). Instrumental corrections as well as the mosaic spread of each of the peaks were taken into account. Also included was an experimental Debye-Waller factor. The irradiation-induced change in the degree of long range chemical order is shown in FIG. 2(*a*). For both samples the order parameter S increases smoothly with fluence and tends to saturate at high fluences. This feature is revealed in the XRD scans by the progressive increase in the (001) superstructure peak for both samples as clearly illustrated for the disordered film in FIG. 2(*b*). The FWHM (full width at the half maximum) for the (001) superstructure peak indicates a continuous increase of the perpendicular coherence length for chemical ordering from 0 to 6 nm ($S_i$=0) and from 18 to 20 nm ($S_i$=0.4) as the fluence ranges from $\Phi$=0 to $\Phi$=4.10$^{16}$ ions/cm$^2$. FIG. 3(a) illustrates the evolution of the (002) fundamental peak under irradiation. For the initially partially ordered film ($S_i$=0.4), the peak is broad and asymmetric at all fluences with no indication of splitting (the chemically ordered and disordered phase have different lattice constants). This result is consistent with the presence of a dispersion of partially ordered regions. For this film, the position for the FePt(002) fundamental peak characteristic of the tetragonal L1$_0$ phase is only slightly modified under irradiation [see the dashed line in FIG. 3(a)]. Also, the FWHM for this fundamental peak decreases slightly with fluence [see FIG. 3(b)]. These findings show that the effect of irradiation is to reduce the dispersion along the (001) growth direction of preexisting partially ordered volumes, i.e., the higher ordered phase regions grown at the expense of the less ordered ones.

For the initially disordered sample ($S_i$=0), the position of the FePt (002) peak characteristic of the cubic disordered phase is slightly modified with increasing fluence. The FWHM for this peak tends to be broader with increasing fluence as shown in FIG. 3(b). This could indicate that dispersed, very small, partially ordered regions not detectable by XRD exist in the non-irradiated film and grow at the expense of the surrounding disordered ones with new c-axis lattice parameters. But the main result here is that the tetragonal distortion for the ordered phase induced in this case is very low since no tetragonal L1$_0$ phase component appears as irradiation proceeds [see dotted line in FIG. 3(a)]. This may be due to the fact that radiation-induced ordering occurs locally in small regions surrounded by a disordered cubic phase. The stress due to such disordered phase areas may prevent relaxation of the lattice parameters towards their equilibrium (L1$_0$ phase) values. On the contrary for the film with initial order parameter $S_i$=0.4, there is a significant probability that the irradiation induced ordering takes place in a volume which is already surrounded by the L1$_0$ tetragonal structure. As a result, the saturation value for both films may differ significantly as seen in FIG. 2(a). Finally, note that no evidence has been found for alternating Fe and Pt planes of the L1$_0$ phase along an in-plane component in either sample types.

The ordering enhancement in both samples can be understood by considering the specific irradiation conditions. There are no displacement cascades, the recoil flux in the film is low, and the average distance of displaced atoms from their initial position is typically 1–3 interatomic distances. Given some mobility at 280° C. and in the absence of athermal Frenkel pair recombination, such atoms stand a good chance of finding a lattice site from which they can relax to a stable position whose local surrounding differs from their initial one. Since the ordered phase has a lower free energy, we expect this radiation-enhanced mobility to provide a mechanism for growth of the ordered phase at the expense of its disordered or less ordered counterpart. Finally, the perpendicular mosaic spread (FWHM of the rocking curve) for the FePt(002) fundamental peak stays nearly constant for both films (~0.8°) indicating that irradiation does not modify the high crystalline quality of the samples. Grazing incidence XRD measurements reveal weak mixing at the FePt/Pt interfaces as irradiation proceeds. This mixing develops through the growth of a preexisting Pt-rich interfacial layer between the FePt and Pt buffer layers, i.e. , from 0.7 nm to 1.3 nm for the disordered film ($S_i$=0) and from 0.5 nm to 0.6 nm for the partially ordered one ($S_i$=0.4). The interdiffusion of the Pt seed film with the FePt film is more effective for the disordered film ($S_i$=0). This is presumably due to the fact that the likelihood of producing a Pt-rich environment is lower for the partially ordered film since it is in a more stable thermodynamic state than the less ordered one.

These structural changes lead to modifications of the hysteresis loop under irradiation which are shown in FIG. 4 (the magnetic field is applied perpendicular to the surface of the film). The loop for the non irradiated disordered film [FIG. 4(a)] demonstrates an in-plane easy magnetization. For this sample, the saturation field decreases with fluence from 11 KOe at $\Phi$=0 to 7 KOe at $\Phi$=4.10$_{16}$ ions/cm$^2$ confirming the increase in perpendicular anisotropy expected when order is enhanced. In the case of the partially ordered sample ($S_i$=0.4) several modifications are observed [see FIG. 4(b)]. The loops at all fluences indicate domains with perpendicular magnetization and can be understood in the framework of the standard model (J. A. Cape and G. W. Lehman, J. Appl. Phys., n°42, p.5732 (1971)) for films with high perpendicular anisotropy. The decrease of the saturation field from 5 KOe to 4 KOe is consistent with the increase of the perpendicular anisotropy. The most striking feature concerns the region where nucleation takes place [denoted by $H_0$ in FIG. b(b)]. The effect of irradiation is both to reduce $H_0$ and to sharpen the nucleation field distribution $\Delta H_0$. Nucleation in films with such high anisotropy is ascribed to a sudden nucleation of magnetic bubbles with opposite magnetization (J. A. Cape and G. W. Lehman, J. Appl. Phys., n°42, P.5732 (1971), A. A. Thiele, Bell Syst. Tech. J., n°50, p.725 (1971)) and the nucleation field for this bubble network varies as the inverse of the wall energy. Thus the likely origin of the decrease of $H_0$ is the magnetic anisotropy increase whereas the decrease of $\Delta H_0$ is due to improved ordering uniformity, inducing a lower dispersion of anisotropy. Finally, it is surprising to note that the loop corresponding to S~0.3 produced by irradiating the initially disordered sample [FIG. 4(a)] does not correspond to domains with perpendicular magnetization such as those shown in FIG. 4(b). We suggest that this difference is due to the difference in the tetragonal distortion between the 2 types of samples.

This technique is expected to work even better in nanometer-size grains, where the growth of the ordered phase could develop more easily. This could improve recording density without changing the present technology.

Note that the magnetic anisotropy of the irradiated film is perfectly homogeneous, that its roughness and its epitaxial quality remain unchanged, and that the effect of the irradiation is cumulative.

The method according to the invention can be used with a mask in order to create discrete magnetic materials with patterned areas of less than, or equal to, one micrometer.

The method according to the invention is easy to implement and is relatively economical.

The material issued from the method according to the invention is usable for binary information storage, in the plane, or perpendicularly to the plane, of the material.

The material produced by the method according to the invention is also usable in magneto-optical devices, and in tunnel junctions and spin valves, as well as in magnetic sensors.

What is claimed is:

1. A method of treating a material that is capable of obtaining a crystalline phase which is more ordered to cause the material to pass from a less ordered phase to the more ordered crystalline phase, the method comprising an operation of irradiating the material by light ions having an energy of 200 keV or less, the irradiation by said light ions inducing displacements of atoms in the material towards positions that favor ordering of the material to obtain the more ordered crystalline phase, wherein said light ions are ions having a mass below or equal to 16 atomic mass units, the method further comprising an operation of simultaneous heating the material, during the irradiation, at temperature of 350° C. or less.

2. A method according to claim 1, including, prior to the irradiation operation, an operation of depositing the material in a layer on a substrate.

3. A method according to claim 1, in which the material is an alloy or a compound.

4. A method according to claim 1, in which the material is a binary alloy, in which the more ordered phase is made up of a stack of planes of atoms each comprising one of species constituting the alloy.

5. A method according to claim 1, in which the material is magnetic.

6. A method according to claim 2, in which the material to be ordered is a disordered or partially ordered magnetic alloy of iron or cobalt with platinum or palladium, wherein the more ordered phase obtained is an $L1_0$ phase.

7. A method according to claim 1, in which the material is heated at a temperature which enables relaxation of the atoms in the material.

8. A method according to claim 1, in which the temperature is comprised between room temperature and 350° C.

9. A method according to claim 1, in which the light ions are helium ions.

10. A method according to claim 1, in which the material is bombarded with light ions at a density of $5 \times 10^{15}$ to $4 \times 10^{16}$ particles per square centimeter.

11. A method according to claim 1, in which the irradiating ions are emitted in a focused ion beam.

12. A method according to claim 1, in which the material to be ordered is underlying other layers of material to form a superimposed layers.

13. A method according to claim 12, in which the superimposed layers are treated simultaneously to cause each of the superimposed layers to pass from the one phase to the more ordered phase.

14. A method according to claim 1, in which the light ions bombard the material through a mask.

15. A method according to claim 1, in which the irradiation causes a magnetic anisotropy of the material to increase.

16. A method comprising:
   depositing a magnetic material on a substrate, wherein the magnetic material is a magnetic alloy of iron or cobalt with platinum or palladium; and
   causing the magnetic material to pass from a ess ordered phase to an $L1_0$ phase by irradiating the magnetic material with light ions having an energy of 200 keV or less, the irradiation by said light ions inducing displacements of atoms in the magnetic material towards positions that favor ordering of the material, wherein said light ions are ions having a mass below or equal to 16 atomic mass unit.

17. A method according to claim 16, in which the magnetic material is heated at a temperature of 350° C. or less, during the irradiation.

18. A method according to claim 17, in which the temperature is comprised between room temperature and 350° C.

* * * * *